United States Patent [19]
Zaremba et al.

[11] Patent Number: 4,868,975
[45] Date of Patent: Sep. 26, 1989

[54] TOOL FOR INSERTING DUAL IN-LINE PACKAGED CIRCUITS INTO PRINTED CIRCUIT BOARD SOCKETS

[75] Inventors: Norman S. Zaremba, St. Charles; John P. Beyer, Western Springs; Thomas R. Glenn, Aurora, all of Ill.

[73] Assignee: AG Communication Systems Corporation, Phoenix, Ariz.

[21] Appl. No.: 279,620

[22] Filed: Dec. 5, 1988

[51] Int. Cl.⁴ .................................. H05K 13/04
[52] U.S. Cl. .............................. 29/741; 29/758
[58] Field of Search ............... 29/741, 758, 764, 278

[56] References Cited

U.S. PATENT DOCUMENTS

| | | | |
|---|---|---|---|
| 4,583,287 | 4/1986 | McDevitt et al. | 29/741 |
| 4,615,110 | 10/1986 | Crone | 29/741 |
| 4,800,647 | 1/1989 | Guyer | 29/741 |

Primary Examiner—Carl E. Hall
Attorney, Agent, or Firm—Robert J. Black; Gregory G. Hendricks

[57] ABSTRACT

A tool adapted to assist in the placement of dual in-line packaged circuits (DIPs) into printed circuit board sockets. The tool includes a channel-shaped body having parallel sides of a springlike material each side having a gripper jaw attached to the lower edge thereof to grasp and support a dual in-line packaged circuit. A manually operated piston operates to force a DIP circuit which is properly oriented to the socket, into the appropriate location with the leads from the circuit placed in proper engagement with a printed circuit board socket. Operation of the piston also in addition to properly placing the circuit, also automatically disengages the tool from the circuit after placement has been effected.

8 Claims, 1 Drawing Sheet

TOOL FOR INSERTING DUAL IN-LINE PACKAGED CIRCUITS INTO PRINTED CIRCUIT BOARD SOCKETS

BACKGROUND OF THE INVENTION

1. Field of the Invention

The present invention relates to tools utilized in the assembly of electronic printed circuit boards and more particularly to a tool useful in the manual assembly of dual in-line packaged (DIP) circuits or components into printed circuit board sockets, ensuring control of the integrity of that assembly process.

2. Description of Background Art

The assembly of socket mounted devices can and has frequently been accomplished in two ways. First, some socketed devices such as dual in-line packages (DIPs) can be mounted automatically using high speed automatic insertion machines currently available from a number of commercial sources. Another method commonly available in the use of a hand held insertion tool which is also generally available from commercial sources.

A number of recent developments have rendered these past methods either obsolete or difficult to implement. These developments include but are not limited to the following:

The state-of-the-art in electronic assembly has identified component lead to socket contact corrosion as a major fault affecting long term reliability of such connections. The use of "lubricants" is now mandated for most socketed devices. Such lubricants, however, are attacked by post soldering cleaning solvents, therefore, they must now be assembled after this process. This requirement eliminates the use of automatic placement equipment, or, in the alternative, makes this process problematic in terms of the quality of placement depending on the configuration of the assembled printed circuit board.

The increased use of DIP packaged microprocessors, application specific integrated circuits (ASICs) and electrically alterable memory devices preempts the use of automatic insertion machines since these devices typically exceed the capability of existing machines.

The high lead count on such DIP devices, coupled with their physical size and relative fragility of the leads, makes the placement and insertion of these devices very difficult to accomplish and virtually impossible to inspect for correct lead-to-socket seating after assembly, whether done manually or automatically. Because of the high density of electronic component packaging, no tool currently available is capable of lead constraint during assembly, coupled with tool extraction as a simultaneous feature.

The only two present methods available to verify the quality of the device to socket connection is to electrically check the assembly or to partially remove the electronic component to manually verify correct lead to socket alignment. The first method, an electrical check, is a questionable technique, inasmuch as devices that have been improperly assembled might still pass the electrical test. Such condition may cause a failure in the "field" due to minute movements which could open the faulty connection. The second method, that of partially removing the devices, is unreliable and may cause component damage since it subjects the devices to additional stresses and reseating may cause subsequent defects.

SUMMARY OF THE INVENTION

The present invention consists of a hand held assembly tool which preempts the possibility of unseated leads by constraining them in the parts positioning phase of assembly. The circuit or component to be assembled to a socket is positioned in the placement head of the insertion tool after which the tool and component are then placed on the target socket. The restraining feature of the tool allows sufficient component lead protrusion for the leads to partially enter the socket. At this point, the proper component to socket positioning is easily verified visually. Once accomplished, actuating the insertion tool simultaneously releases the component and forces it to completely seat in the receiving socket.

A particularly unique feature of the present tool is that is preempts the creation of defective assemblies by positively constraining the component leads so they cannot deform to cause the typical unseated component condition. The device will either locate properly in the socket or it cannot be assembled. Since very high insertion forces are required to seat the component, it is extremely difficult to determine whether a single unseated component lead could be detected by an operator using those manual insertion tools presently available. This, in fact, has been found to be the case and is the basis for the tool design. Its purpose is prevention, not detection.

As an added feature, the placement of the component into the tool provides a defacto inspection function of the quality of the component to be assembled. In other words, if the device cannot be properly "loaded" into the tool, then the tolerances of body and lead locations are not acceptable and assembly should not be attempted. No other tool presently available commercially provides these features.

DESCRIPTION OF THE PREFERRED EMBODIMENT

Figure 1:
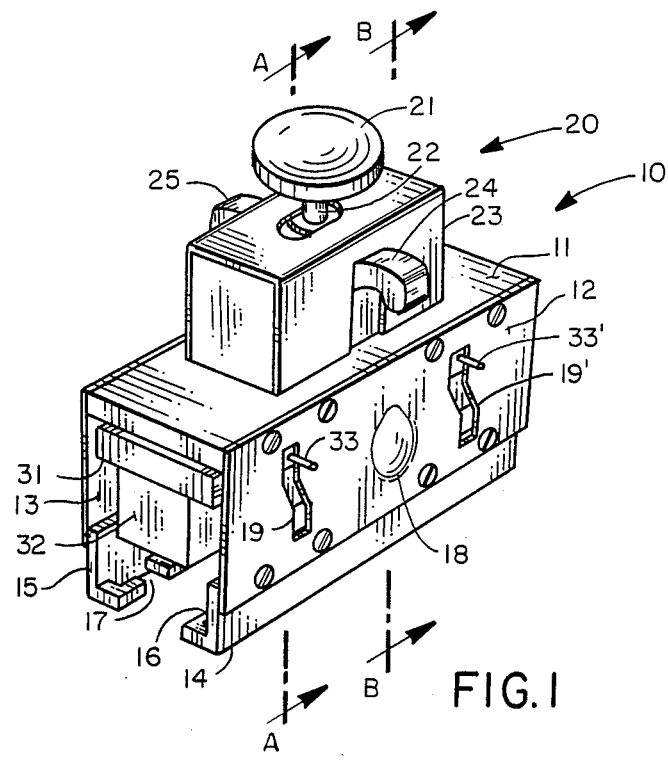
FIG. 1 is a perspective view of a hand held tool for inserting dual in-line packaged circuits (DIPs) into printed circuit board sockets, in accordance with the present invention.

Referring now to FIG. 1, a hand assembly tool in accordance with the present invention is shown. The tool, consisting of a channel shaped body portion 10, has two sides 12 and 13 both made of a compliant material such as spring steel, certain flexible plastics, etc. Embossed into each sidewall is a teardrop-shaped embossed or raised area which may also be seen by reference to FIGS. 2 and 3 as embosses 18 and 18'. The units, when engaged by a downward motion of a portion of the plunger mechanism 31, which shall be described in detail later, are used to force the two sides 12 and 13 in an outward direction.

Also included in each side is a pair of vertical slots 19 and 19'. These slots, however, are not straight in that the angle included therein helps facilitate a forward motion of the housing 10 which will be described in detail later on. Attached to the bottom of each of the sides 12 and 13 is an inward facing gripper jaw, such as 14 and 15 respectively. Each gripper jaw in turn has a plurality of L-shaped openings such as 16 and 17 of which a further detail might be seen by reference to FIG. 4. The gripper jaws and the openings included therein suffice to position dual in-line packaged components or circuits in such a manner that they provide a protective and orientating location for leads 41 and 42 extending from the DIP component and which appear in FIGS. 2, 3, 4 and 5.

Attached to the top of the housing 10 is a separate housing 20 which has a piston 22 supported by housing 20 with piston 22 having a finger operating button 21 on its end. Also attached to housing 20 are a pair of finger grasping brackets 24 and 25. Located within the housing is a lower part of the plunger assembly consisting of section 31 which is engaged by plunger 22. Section 31 finds support and proper positioning by means of a plurality of dual cam actuators 33 and 33' as well as 34 and 34' (not shown). These actuators extend through the slots 19 and 19' on side 12 and similar slots (not shown) on side 13.

Fastened to the lower portion of section 31 of the plunger is the component engaging section or actuating section 32 which when the plunger is in the operated condition applies pressure to the component to be inserted in a printed circuit board socket, forcing it into the socket in its proper destination.

Figure 2:
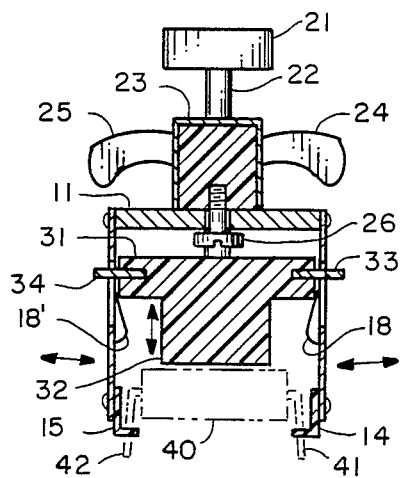
FIG. 2 is a sectional view of an insertion tool taken along lines A—A of FIG. 1 and in accordance with the present invention.

Referring now to FIG. 2 which is a cross-section of the tool of the present invention taken along lines A—A of FIG. 1, the components previously described are shown in cross-section with the addition of jam screw 26 which along with jam screw 26' (not shown) are used to secure the upper plunger base 23 to the top of the main base 11 to maintain a secured position. However, it should be noted that the opening in top 11 is elongated in the same direction as the side panels are oriented so that when the upper plunger portion is operated (as will be described later herein), the lower housing portion is free to move forward and still be supported by the head of jam screw 26 and jam screw 26'.

Figure 3:
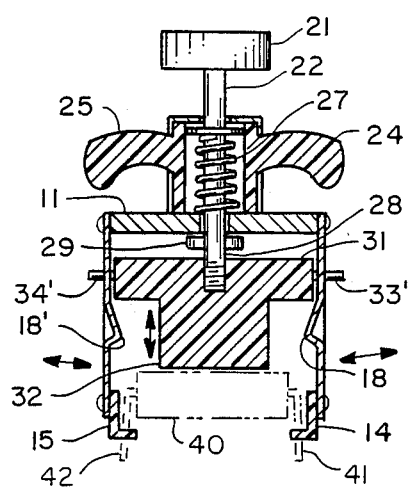
FIG. 3 is a cross-sectional view of an insertion tool in accordance with the present invention taken along lines B—B of FIG. 1.

Referring now to FIG. 3, another sectional view taken through the tool of the present invention along lines B—B of FIG. 1 is shown. The principal distinction between this sectional view and that of FIG. 2 is that it is taken right through the center of piston 22 and shows the addition to piston 22 a surrounding and supporting spring 27 which acts to maintain the plunger in the upper position. The lower end of piston 22 is shown as engaging the upper section 31 of the lower portion of the piston 22.

Figures 4, 5:
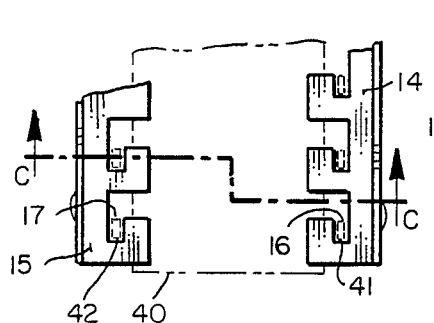
FIG. 4 is a partial bottom view of an insertion tool in accordance with the present invention showing a dual in-line packaged circuit retained within said tool.
FIG. 5 is a partial end view of an insertion tool in accordance with the present invention showing a dual in-line packaged circuit located within the constraints of said tool.

Referring now to FIG. 4, a portion of the bottom of the tool of the instant invention is shown, particularly the gripper jaws 14 and 15 which each have a plurality of openings such as 16 and 17, respectively. These openings are L-shaped and as can be seen from FIG. 4 the component to be mounted is placed within the lower portion of the tool but above the gripper jaws and with the leads such as 41 and 42 first moved into the lateral portions of openings 16 and 17 and then down in the retention position as shown in FIG. 4. As can be seen by reference to FIG. 4, the gripper jaws 14 and 15 retain the component leads such as 41 and 42 in their proper position so that they cannot be deformed during the insertion operation.

Reference is now made to FIG. 5 which is a partial end view of the tool of the present invention showing the component 40 in its preinsertion position where the pins 41 and 42 are retained in openings 16 and 17 of gripper jaws 14 and 15, respectively. It may be seen by reference to this figure that the component is supported on the gripper jaws 14 and 15 with the pins properly aligned for positioning into the socket of the printed circuit board.

Figure 6:
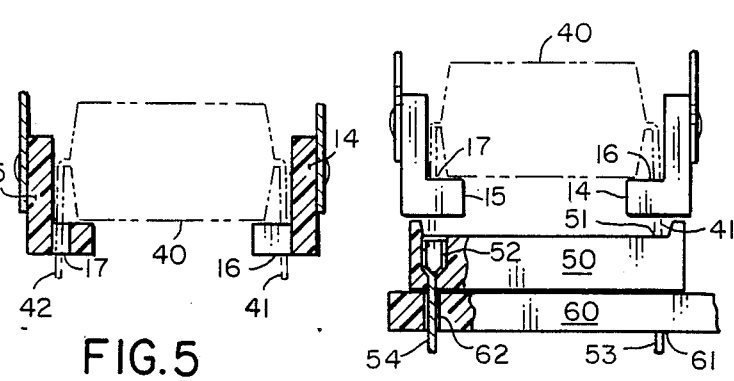
FIG. 6 is a partial end view of an insertion tool in accordance with the present invention showing a dual in-line packaged circuit located within the constraints of the tool and positioned in preparation for insertion of the leads associated with the circuit into a socket mounted to a printed circuit board.

FIG. 6 is similar to FIG. 5 but in addition shows the printed circuit socket 50 mounted on printed circuit board 60 where its leads 53 and 54 are inserted in openings 61 and 62 of the printed circuit board. The tool is now positioned over socket 50 in such a manner that pins 41 and 42, respectively, are oriented to properly find location in socket openings and 51 and 52, respectively. At this time the operator of the tool, referring back to FIG. 1, will grasp the upper portion of the tool with fingers placed beneath finger grips 25 and 24 and the thumb on button 21 which will in turn operate piston 22 with the the lower portion 32 of piston 22 pressing down on component 40 to properly insert it into the openings in socket 50. At the same time the tool lower portion gripper jaws will slide forward and downward inserting the component and at the same time dislodging the tool from the engagement with the DIP component. Thus, from the foregoing it would be apparent that components may be seated while maintaining the integrity of the leads associated therewith without danger of deformation or misalignment.

While but a single embodiment of the present invention has been shown, it will be obvious to those skilled in the art that numerous modifications may be made without departing from the spirit of the present invention which shall be limited only by the scope of the claims appended hereto.

What is claimed is:

1. A tool to facilitate the placement of dual in-line packaged (DIP) circuits into printed circuit board sockets, said tool comprising:

a channel shaped body including a rectangular top, a pair of parallel rectangular sides, a pair of open ends and an open bottom;

a pair of inward facing gripper jaws of rigid construction, each attached to one of said sides, projecting into said open bottom, each jaw including a plurality of L-shaped circuit lead receiving and retention openings, said jaws for supporting a DIP circuit within said body;

a pair of inward facing lobes, each centrally located on a different one of said sides;

a plunger assembly including an external portion positioned on the outside of said top, said plunger assembly external portion including a manually operable piston extending through said top;

said plunger assembly further including an internal portion located within said housing including a first rectangular section retained within said housing by a plurality of cam actuators extending from said first section to slots in each of said sides, a second rectangular section secured to the bottom of said first section movable into contact with a DIP circuit supported within said body;

said slots each comprising first and second vertical sections and an angularly oriented section between said first and second sections, said second section laterally displaced from said first section in a first lateral direction;

said plunger assembly piston connected to said plunger assembly internal first section;

and in response to the manual operation of said piston in a downward direction said body initially moving in a second lateral direction and subsequently thereto said sides moving in an outward direction and said plunger second section moving downward to contact a DIP circuit, whereby a plurality of leads extending from a DIP circuit and retained within said L-shaped circuit lead receiving and retention openings are positioned and placed into contact with said printed circuit board socket and in response to said second section lateral movement, said DIP circuit is released from said tool.

2. A tool as claimed in claim 1 wherein:
said sides are fabricated of spring steel.

3. A tool as claimed in claim 2 wherein:
said inward facing lobes are of a teardrop-shaped configuration and in response to operation of said plunger assembly said sides are moved in an outward direction in response to contact with said teardrop-shaped lobes.

4. A tool as claimed in claim 1 wherein: said plunger assembly further includes a finger receiving button attached to said piston.

5. A tool as claimed in claim 1 wherein:
said plunger assembly further includes a spring operated return mechanism associated with said piston.

6. A tool as claimed in claim 1 wherein:
said external portion of said plunger assembly further includes a plurality of stationary finger grips grasped in combination with operation of said piston.

7. A tool as claimed in claim 1 wherein:
said body top includes a plurality of openings each dimensionally longer in a direction parallel to said sides than in the direction of said opening parallel to said body ends.

8. A tool as claimed in claim 1 wherein:
said cam actuators extending from said first section each comprise a pin extending through one of said slots in one of said sides.

* * * * *